US012701896B2

(12) United States Patent
Yu et al.

(10) Patent No.: US 12,701,896 B2
(45) Date of Patent: Aug. 4, 2026

(54) DISPLAY PANELS FOR IMPROVING ACCURACY OF FINGERPRINT RECOGNITION AND DISPLAY DEVICES HAVING THE SAME

(71) Applicant: WUHAN CHINA STAR OPTOELECTRONICS SEMICONDUCTOR DISPLAY TECHNOLOGY CO., LTD., Wuhan (CN)

(72) Inventors: Shengrong Yu, Wuhan (CN); Xi He, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 365 days.

(21) Appl. No.: 18/372,877

(22) Filed: Sep. 26, 2023

(65) Prior Publication Data

US 2024/0334779 A1 Oct. 3, 2024

(30) Foreign Application Priority Data

Jan. 31, 2023 (CN) .......................... 202310098866.X

(51) Int. Cl.
*H10K 59/12* (2023.01)
*G06V 40/13* (2022.01)
(Continued)

(52) U.S. Cl.
CPC ......... *H10K 59/65* (2023.02); *G06V 40/1318* (2022.01); *H10K 59/122* (2023.02);
(Continued)

(58) Field of Classification Search
CPC .... H10K 59/65; H10K 59/122; H10K 59/879; G06V 40/1318
(Continued)

(56) References Cited

U.S. PATENT DOCUMENTS

| | | | |
|---|---|---|---|
| 2018/0053815 A1* | 2/2018 | Lee ......................... | H10K 59/38 |
| 2022/0309267 A1* | 9/2022 | Kim ....................... | H10K 59/38 |

FOREIGN PATENT DOCUMENTS

| | | | | |
|---|---|---|---|---|
| CN | 113517326 A | * 10/2001 | ............. | H04N 23/57 |
| CN | 110164384 A | * 8/2019 | ........... | G09G 3/3291 |

(Continued)

*Primary Examiner* — Phuc T Dang
(74) *Attorney, Agent, or Firm* — The Roy Gross Law Firm, LLC; Roy D. Gross

(57) ABSTRACT

Display panels and display devices are provided. The display panel includes a substrate, a plurality of pixel driving units and a plurality of photosensitive units disposed on the substrate, a first planarization layer disposed on a side of the pixel driving units and the photosensitive units away from the substrate, a second planarization layer disposed on a side of the first planarization layer away from the substrate, and a light-emitting element layer disposed on a side of the second planarization layer away from the substrate. The first planarization layer has a first refractive index, and the second planarization layer has a second refractive index less than the first refractive index. At least one of the first planarization layer and the second planarization layer includes a resistance material.

20 Claims, 4 Drawing Sheets

(51) Int. Cl.
*H10K 59/122* (2023.01)
*H10K 59/38* (2023.01)
*H10K 59/65* (2023.01)
*H10K 59/80* (2023.01)

(52) U.S. Cl.
CPC ........... *H10K 59/38* (2023.02); *H10K 59/879* (2023.02); *H10K 59/8792* (2023.02)

(58) Field of Classification Search
USPC .......................................................... 257/40
See application file for complete search history.

(56) References Cited

FOREIGN PATENT DOCUMENTS

| | | | | | |
|---|---|---|---|---|---|
| CN | 111584558 A | * | 8/2020 | ......... | G06V 40/1324 |
| CN | 114823821 A | * | 7/2022 | ........... | H10K 59/122 |

* cited by examiner

DISPLAY PANELS FOR IMPROVING ACCURACY OF FINGERPRINT RECOGNITION AND DISPLAY DEVICES HAVING THE SAME

CROSS-REFERENCE TO RELATED APPLICATION

This application claims priority to Chinese Patent Application No. 202310098866.X, filed on Jan. 31, 2023, the disclosure of which is incorporated herein by reference in its entirety.

TECHNICAL FIELD

The present disclosure relates to the field of display technologies, and in particular, to display panels and display devices.

BACKGROUND

A fingerprint recognition in a full-screen may be realized by integrating photosensitive PIN junctions of the fingerprint recognition in an array substrate (that is, an intrinsic semiconductor layer is added between a P-type semiconductor material and an N-type semiconductor material to form a PIN-structured diode).

FIG. 1 is a structural schematic diagram of an existing optical fingerprint recognition based on an organic light-emitting diode PIN structure. The light received by a PIN photosensitive fingerprint sensor (ie, the PIN junction in FIG. 1) may come from four optical paths. A first optical path 1 is that the light emitted by a light-emitting element is reflected to the PIN junction through metal layers (a cathode layer CA and a source-drain layer SD). A second optical path 2 is that the light emitted by the light-emitting element is reflected to the PIN junction through a touch metal DOT. A third optical path 3 is that the light emitted by the light-emitting element is reflected to the PIN junction through a finger. A fourth optical path 4 is that the external ambient light is irradiated to the PIN junction.

In order to accurately obtain a fingerprint pattern, it is expected that the PIN junction only receives light traveling along the third optical path 3. However, in actual application, the PIN junction may receive light traveling along the optical paths 1, 2, 3, and 4, resulting in a small optical signal-to-noise ratio, causing the problem of reduced fingerprint recognition accuracy.

SUMMARY

In view of above, display panels are provided according to embodiments of the present disclosure. The display panel includes a substrate, a plurality of pixel driving units and a plurality of photosensitive units disposed on the substrate, a first planarization layer disposed on a side of the pixel driving units and the photosensitive units away from the substrate, a second planarization layer disposed on a side of the first planarization layer away from the substrate, and a light-emitting element layer disposed on a side of the second planarization layer away from the substrate. The first planarization layer has a first refractive index, and the second planarization layer has a second refractive index less than the first refractive index. At least one of the first planarization layer and the second planarization layer includes a resistance material.

Display devices are further provided according to embodiments of the present disclosure. The display device includes the above-mentioned display panel.

BRIEF DESCRIPTION OF THE DRAWINGS

In order to more clearly illustrate the technical solutions in the embodiments of the present disclosure, the drawings that need to be used in the description of the embodiments will be briefly introduced below. Obviously, the drawings in the following description are only some embodiments of the present disclosure. For those skilled in the art, other drawings may also be obtained based on these drawings without any creative effort.

DETAILED DESCRIPTION

Figure 1:
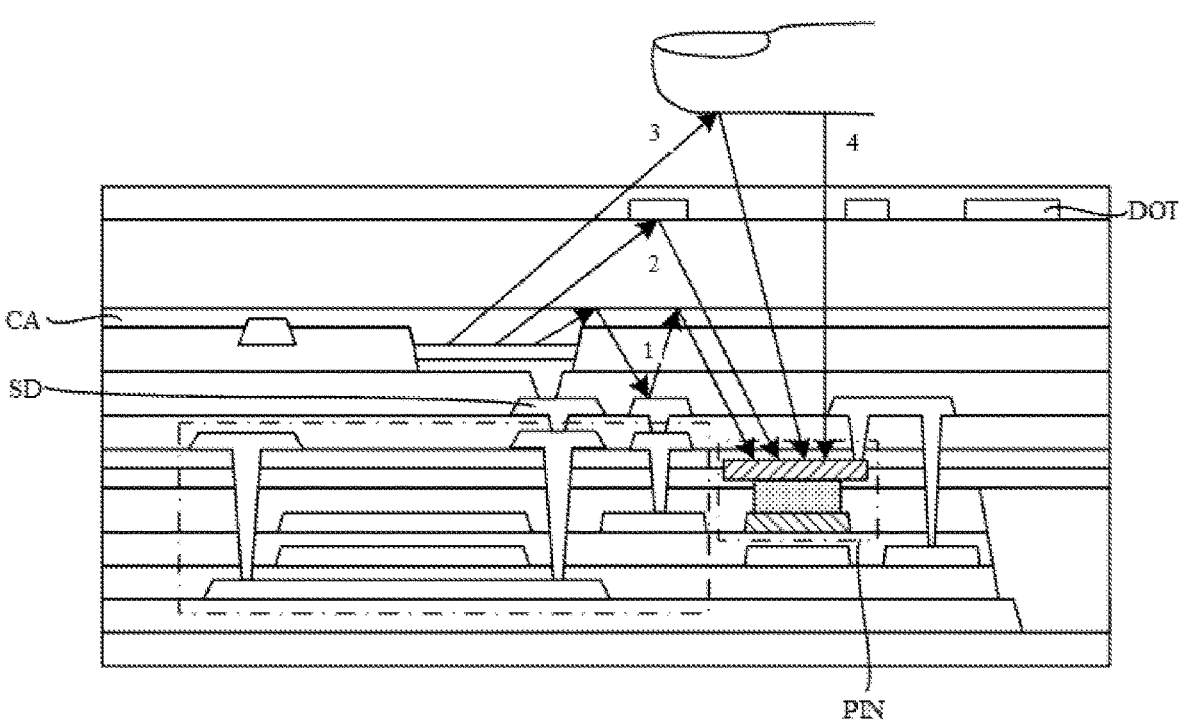
FIG. 1 is a schematic structural diagram of a display panel in related art.

Technical solutions in the embodiments of the present disclosure will be clearly and completely described below with reference to the accompanying drawings. Obviously, the described embodiments are only some of the embodiments of the present disclosure, not all of them. Based on the embodiments in the present disclosure, all other embodiments obtained by those skilled in the art without making creative efforts belong to the scope of protection of this application. In addition, it should be understood that the specific embodiments described here are only used to illustrate and explain the present disclosure, not intended to limit the present disclosure. In this disclosure, unless stated otherwise, the used orientational terms such as "up" and "down" generally refer to up and down in the actual use or working state of the device, specifically the directions in the drawings. The terms "inside" and "outside" refer to the outline of the installation.

Figure 2A:
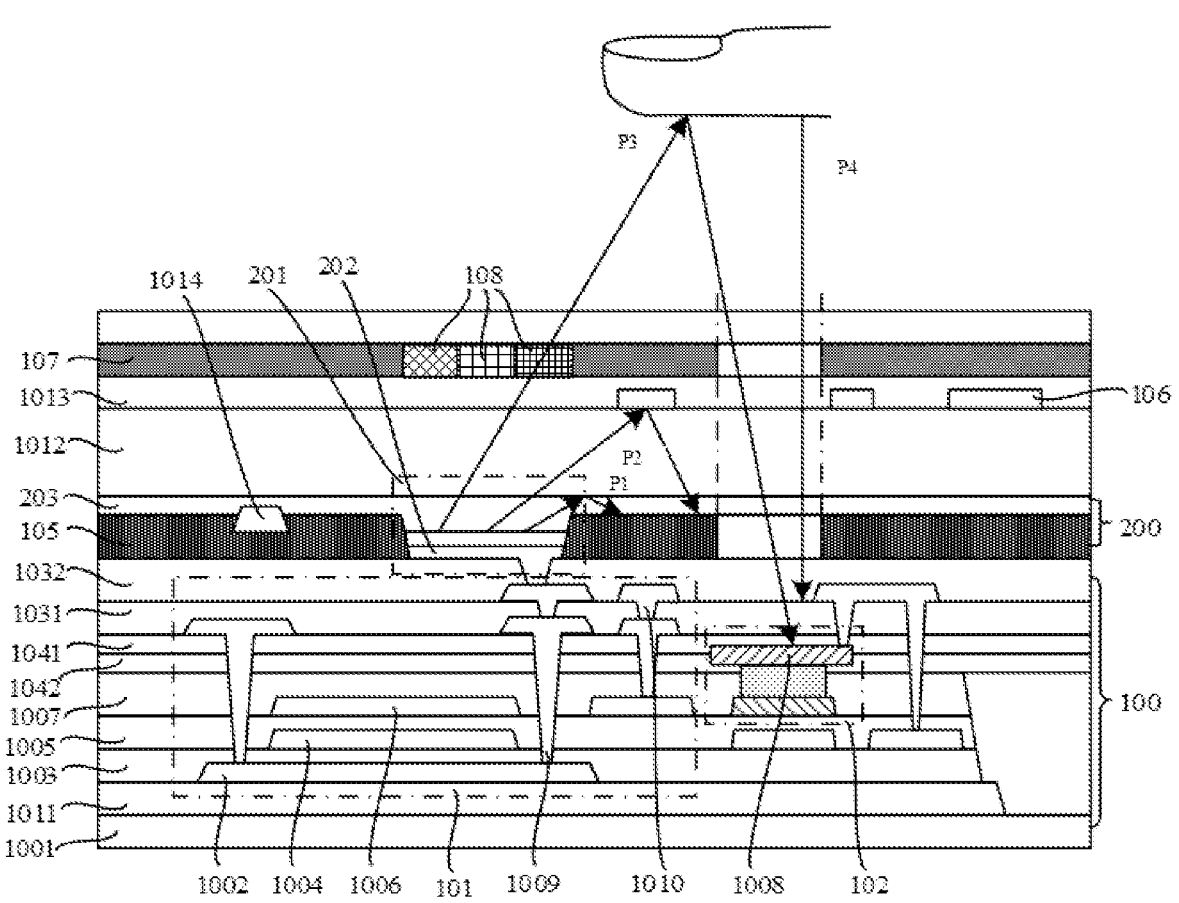
FIG. 2A and FIG. 2B are schematic structural views of a display panel provided in an embodiment of the present disclosure.
Figure 2B:
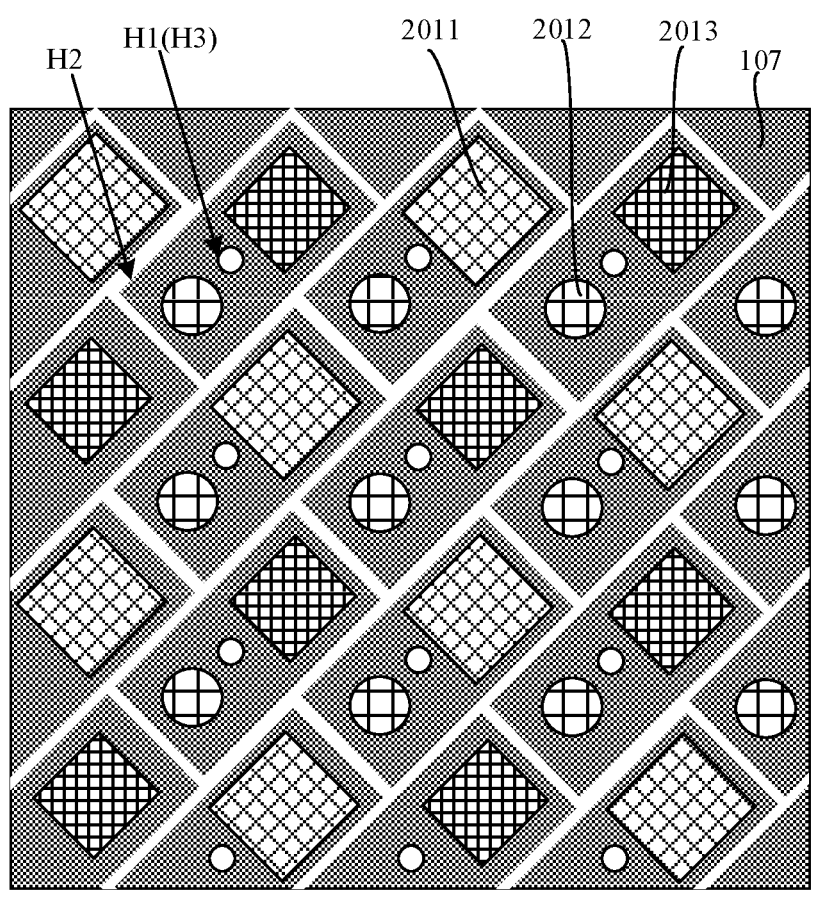

Specifically, FIG. 2A and FIG. 2B are schematic structural diagrams of a display panel provided in an embodiment of the present disclosure.

Embodiments of the present disclosure provide display panels, and the display panel includes an array substrate 100 and a light-emitting element layer 200.

The array substrate 100 includes a substrate 1001, a plurality of pixel driving units 101, a plurality of photosensitive units 102, and a planarization layer.

In some embodiments, the substrate 1001 may include a rigid substrate and a flexible substrate. In some embodiments, the substrate 1001 may be made of glass, polyimide, quartz, or and the like. In some embodiments, a buffer layer 1011 may be further provided on the substrate 1001.

The plurality of the pixel driving units 101 are disposed on a side of the substrate 1001.

The plurality of the photosensitive units 102 are arranged on a side of the substrate 1001, and are each arranged between adjacent pixel driving units 101. The plurality of photosensitive units 102 and the plurality of pixel driving units 101 are arranged at intervals. In some embodiments, the plurality of the photosensitive units 102 are configured to realize a fingerprint recognition function. In some embodiments, the photosensitive unit 102 may be integrated in the array substrate 100 in a form of a fingerprint recognition photosensitive PIN junction.

The planarization layer is located on the plurality of pixel driving units 101 and the plurality of photosensitive units 102, and the planarization layer at least includes a first planarization layer 1031 and a second planarization layer 1032.

The first planarization layer 1031 is disposed on a side of the pixel driving units 101 and the photosensitive units 102 away from the substrate 1001.

The second planarization layer 1032 is disposed on a side of the first planarization layer 1031 away from the substrate 1001. At least one of the first planarization layer 1031 and the second planarization layer 1032 includes a resistance material.

The light-emitting element layer 200 is located on the array substrate 100. In some embodiments, the light-emitting element layer 200 is disposed on a side of the second planarization layer 1032 away from the substrate 1001. The light-emitting element layer 200 includes a plurality of light-emitting elements 201, and the plurality of light-emitting elements 201 are electrically and correspondingly connected to the pixel driving units 101, respectively. The plurality of the pixel driving units 101 are configured to correspondingly drive the light-emitting elements 201 to realize the display function.

In some embodiments, the light-emitting element 201 may be an organic light-emitting diode, a submillimeter light-emitting diode, a micro light-emitting diode, or the like.

In some embodiments, each of the light-emitting elements 201 includes an anode, a cathode, and a light-emitting layer between the anode and the cathode. In some embodiments, the light-emitting element 201 further includes unshown parts such as a hole transport layer, a hole injection layer, an electron transport layer, and an electron injection layer. In some embodiments, the light-emitting layer may include quantum dot materials, fluorescent materials, and the like.

When performing fingerprint recognition, part of the ambient light (such as infrared light, with a wavelength range of about 600 nm to 760 nm) may pass through the finger (an optical path illustrated as P4 in FIG. 2A) and irradiate a surface of the photosensitive unit 102, which affects the accuracy of fingerprint recognition. Therefore, by making at least one of the first planarization layer 1031 and the second planarization layer 1032 include the resistance material, it is possible to filter out the light in the ambient light passing through the finger, thereby reducing the impact of the ambient light on the light for realizing the fingerprint recognition, which may improve the optical signal-to-noise ratio and improve the accuracy of fingerprint recognition while realizing the planarization function.

In some embodiments, the resistance material is a color resistance material (the color resistance material refers to a resistance material other than a transparent resistance material and a black resistance material). The color resistance material is a resistance material having a maximum absorption wavelength in the range of 600 nm to 760 nm.

In some embodiments, the color resistance material may include one or more of a blue resistance material, a light cyan resistance material, a cyan resistance material, a red resistance material, a green resistance material, a yellow color resistance material, a purple color resistance material, and an orange resistance material.

In some embodiments, the resistance material may include pigments and dyes. The pigments may be known pigments. For example, the pigments may be compounds classified as pigments in the color index (Published by the society of dyers and colourists), such as yellow pigments having the color index (C. I.) of Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, etc.; orange pigments having the color index (C. I.) of Pigment Orange 2, 5, 13, 16, 17:1, 31, 34, 36, 38, 43, 46, 48, 49, 51, 52, 55, 59, 60, 61, 62, 64, 71, 73 etc.; red pigments having the color index (C. I.) of Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, etc.; green pigments having the color index (C. I.) of Pigment Green 7, 10, 36, 37, 58, 59, etc.; and purple pigments having the color index (C. I.) of Pigment Violet 1, 19, 23, 27, 32, 37, 42, etc.; blue pigments having the color index (C. I.) of Pigment Blue 1, 2, 15, 15:1, 15:2, 15:3, 15:4, 15:6, 16, 22, 60, 64, 66, 79, 80 etc. The resistance material may include one or a combination of yellow pigments, orange pigments, red pigments, green pigments, purple pigments, and blue pigments. The dyes may be determined according to the spectral spectrum to be filtered out. In some embodiments, the dyes may comprise xanthanone dyes.

In some embodiments, the resistance material may also include a black resistance material (such as carbon black resistance material, titanium black resistance material, or other resistance materials) that absorbs part of visible light and infrared rays.

In some embodiments, that at least one of the first planarization layer 1031 and the second planarization layer 1032 includes the resistance material may be that the first planarization layer 1031 includes a first organic material and a first resistance material and the second planarization layer 1032 includes a second organic material and a second resistance material. The first resistance material includes a color resistance material, and the second resistance material includes a color resistance material. In some embodiments, one of the first resistance material and the second resistance material is a blue resistance material to absorb light with a wavelength range of 600 nm to 760 nm.

In some embodiments, that at least one of the first planarization layer 1031 and the second planarization layer 1032 includes the resistance material may also be that the first planarization layer 1031 includes a first organic material and a first resistance material (the first resistance material includes a color resistance material, for example, the first resistance material is a blue resistance material to absorb light with a wavelength range of 600 nm to 760 nm) and the second planarization layer 1032 includes a second organic material; or may also be that the first planarization layer 1031 includes a first organic material and the second planarization layer 1032 includes a second organic material and a second resistance material (the second resistance material includes a color resistance material, and the second resistance material is a blue resistance material to absorb light with a wavelength range of 600 nm to 760 nm).

In some embodiments, the first organic material and the second organic material are the same or different. The resistance materials included in the first planarization layer 1031 and the second planarization layer 1032 may be the same or different. Concentrations of the resistance materials included in the first planarization layer 1031 and the second planarization layer 1032 may be the same or different.

In some embodiments, on a condition that the first planarization layer 1031 includes the first organic material and the first resistance material, and the second planarization layer 1032 includes the second organic material and the second resistance material, in order to ensure that the photosensitive units 102 can receive the light used to realize the fingerprint recognition, a wavelength band of the light transmitted by the first resistance material and a wavelength band of the light transmitted the second resistance material at least partially overlap, so that the light used to realize the fingerprint recognition may be received by the photosensitive units 102.

In some embodiments, a sum of thicknesses of the first planarization layer 1031 and the second planarization layer 1032 is greater than or equal to 1 micron and less than or equal to 4 microns, so that the first planarization layer 1031 and the second planarization layer 1032 performs the function of planarization.

In some embodiments, in order to further increase the light received by the photosensitive units 102 for the fingerprint recognition, the first planarization layer 1031 and the second planarization layer 1032 may have different refractive indices.

In some embodiments, the first planarization layer 1031 has a first refractive index n1, the second planarization layer 1032 has a second refractive index n2, and the second refractive index n2 is less than the first refractive index n1, so as to improve a probability that the light reflected by the finger for fingerprint recognition (an optical path illustrated as P3 in FIG. 2A) is converged to surfaces of the photosensitive units 102.

Figure 3:
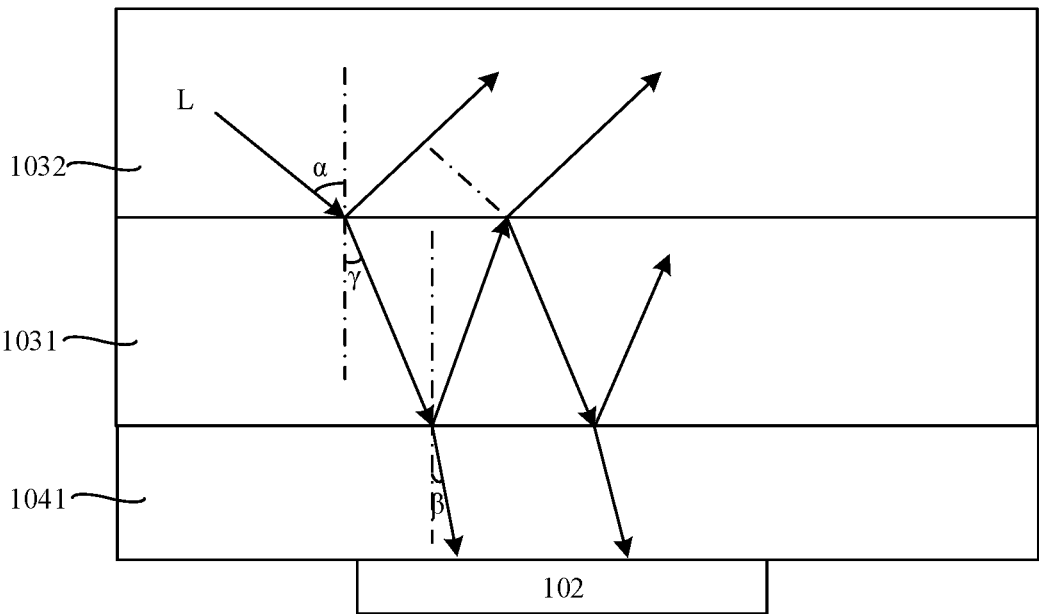
FIG. 3 is a schematic diagram of light refraction at an interface between a planarization layer and a protective layer provided in an embodiment of the present disclosure.

Specifically, FIG. 3 is a schematic diagram of light refraction at the interface between the planarization layer and the protective layer provided in an embodiment of the present disclosure. Since the second refractive index n2 is less than the first refractive index n1, when light L enters the first planarization layer 1031 from the second planarization layer 1032, a first incidence angle $\alpha$ is greater than a first refracted angle $\gamma$. Therefore, the light configured to realize the fingerprint recognition that may not be projected onto the surfaces of the photosensitive units 102 originally may be projected onto surfaces of the photosensitive units 102 through the second planarization layer 1032 and the first planarization layer 1031, which further improves the optical signal-to-noise ratio and the accuracy of fingerprint recognition.

In some embodiments, referring to FIG. 2A and FIG. 3, the array substrate 100 further includes a first protective layer 1041 located between the photosensitive units 102 and the first planarization layer 1031. The first protective layer 1041 has a third refractive index n3 greater than the first refractive index n1 and greater than the second refractive index n2.

Since the third refractive index n3 is greater than the first refractive index n1 and greater than the second refractive index n2, so that the first incidence angle $\alpha$ is greater than an exit angle $\beta$ of the light from the first planarization layer 1041, thereby increasing the light projected onto the surfaces of the photosensitive units 102 for fingerprint recognition, which may further improve the optical signal-to-noise ratio and the accuracy of fingerprint recognition.

In some embodiments, the first protective layer 1041 includes an inorganic material. In some embodiments, the first protection layer 1041 includes silicon oxide, silicon nitride, silicon oxynitride, aluminum oxide, tantalum oxide, hafnium oxide, zirconium oxide, titanium oxide, or the like.

In some embodiments, the first refractive index n1 and the second refractive index n2 may be adjusted by adjusting the types and concentrations of the resistance materials included in the first planarization layer 1031 and the second planarization layer 1032.

Referring to FIG. 2A and FIG. 2B, the display panel further includes a pixel definition layer 105, a touch layer 106, and a color filter layer.

The pixel definition layer 105 is arranged between the second planarization layer 1032 and the light-emitting element layer 200. The pixel definition layer 105 includes first pixel openings corresponding to the light-emitting elements 201 and first photosensitive openings H1 corresponding to the photosensitive units 102. The pixel definition layer 105 includes a black resistance material, which absorb the light of the light-emitting element 201 projected to the surfaces of the photosensitive units 102 and reflected by metal film layers (illustrated as optical paths P1 and P2 in FIG. 2A), so as to further improve the optical signal-to-noise ratio and the accuracy of fingerprint recognition. The optical path P3 in FIG. 2A represents the light reflected by the finger to the light photosensitive unit 102.

The touch layer 106 is arranged on a side of the light-emitting element layer 200 away from the substrate 1001. The touch layer 106 includes a metal sublayer including second pixel openings corresponding to the light-emitting elements 201 and second photosensitive openings H2 corresponding to the photosensitive units.

The color filter layer is arranged on a side of the touch layer 106 away from the substrate 1001. The color filter layer includes a light shielding layer 107 and filter units 108. The light shielding layer 107 includes third pixel openings corresponding to the light-emitting elements 201 and third photosensitive openings H3 corresponding to the photosensitive units 102, and the filter units 108 are arranged corresponding to the third pixel openings.

Referring to FIG. 2A and FIG. 2B, in some embodiments, the second pixel opening coincides with the second photosensitive opening H2. Orthographic projections of two light-emitting elements 201 on the touch layer 106 are located within one of the second pixel openings. An orthographic projection of each of the third photosensitive openings H3 on the touch layer 106 is located between the orthographic projections of the two light-emitting elements 201 on the touch layer 106, so that as many third photosensitive openings H3 as possible are added under the condition that the arrangement of the plurality of light-emitting elements 201 remains unchanged, so that the light-emitting elements 201 realizing the display function, the metal sublayer realizing the touch function, and areas realizing the fingerprint recognition function may be evenly distributed in the display panel, so that the display panel has better display function, touch function, and better fingerprint recognition function at the same time.

In some embodiments, the display panel includes a plurality of sub-pixels. The plurality of sub-pixels include first sub-pixels 2011, second sub-pixels 2012, and third sub-pixels 2013. In some embodiments, each of the sub-pixels correspondingly includes one of the light-emitting elements 201. Light-emitting colors of the plurality of sub-pixels include red, green, blue, white and so on. In some embodiments, the third photosensitive openings H3 is located between the first sub-pixel 2011 and the second sub-pixel 2012, and/or the third photosensitive opening H3 is located between the second sub-pixel 2012 and the third sub-pixel 2013. In some embodiments, the light-emitting color of the first sub-pixel 2011 includes red, the light-emitting color of the second sub-pixel 2012 includes green, and the light-emitting color of the third sub-pixel 2013 includes blue.

In some embodiments, the light shielding layer 107 includes a black resistance material. An orthographic projection of the light-photosensitive unit 102 on the light shielding layer 107 is located within a boundary of the corresponding third photosensitive opening H3, so as to ensure that the light-photosensitive unit 102 has a larger light-receiving area while relieving the crosstalk problem of multiple valley signals.

Figure 4:
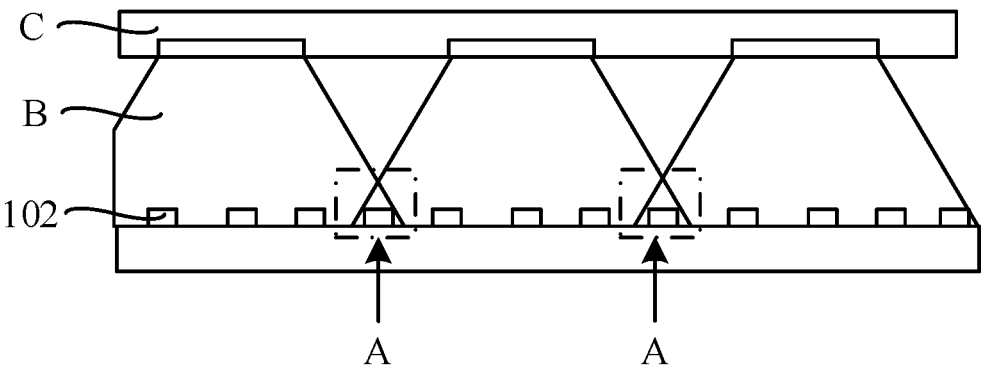
FIG. 4 is a schematic diagram of crosstalk of multiple valley signals provided in an embodiment of the present disclosure.

FIG. 4 is a schematic diagram of the crosstalk of multiple valley signals provided in an embodiment of the present disclosure. When the fingerprint recognition function is implemented, the light reflected by the fingerprint may have the problem of crosstalk (as illustrated at part A in FIG. 4) between the multiple valley signals, which affects the accuracy of the fingerprint recognition. An area B as illustrated in FIG. 4 represents a reflected light area, and an area C represents a fingerprint area. Therefore, the light shielding layer 107 including the third photosensitive openings H3 may be provided in the display panel to form collimating structures, which correspondingly converge the light reflected by the fingerprint to the surfaces of the photosensitive units 102, so as to avoid the crosstalk of multiple valley signals, resulting in the reduction of fingerprint recognition accuracy.

Figure 5:
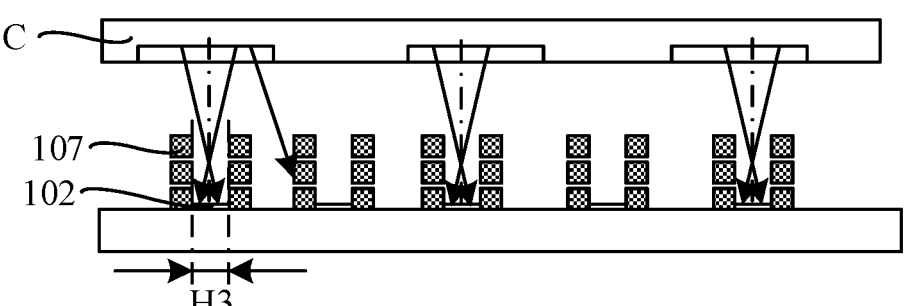
FIG. 5 is a schematic diagram of how a light shielding layer provided in an embodiment of the present disclosure relieves a signal crosstalk problem of multiple valley signals.

FIG. 5 is a schematic diagram of how the light shielding layer 107 provided in the embodiments of the present disclosure relieves the crosstalk problem of multiple valley signals. After the light shielding layer 107 is arranged, a signal reflected by the fingerprint is irradiated by the corresponding third photosensitive opening H3 to the surface of the photosensitive unit 102, and a crosstalk signal between the multiple valley signals may be absorbed by the light shielding layer 107, so that the crosstalk problem between the multiple valley signals may be avoided.

In some embodiments, the light shielding layer 107 may be provided in one or more layers. In some embodiments, each of the third photosensitive openings H3 corresponds to one of the photosensitive units 102.

In some embodiments, the pixel definition layer 105 may also be reused as another light shielding layer 107, so that the display panel may realize a design of multi-layer light shielding layers 107.

In some embodiments, referring to FIG. 2A and FIG. 2B, the light-emitting element layer 200 further includes an anode layer 202 located on the second planarization layer 1032. The anode layer 202 includes a plurality of anodes included in the light-emitting elements 201. Each anode is electrically connected to the corresponding pixel driving unit 101. The first pixel openings expose the plurality of anodes, so that the light of the light-emitting elements 201 projected to the surfaces of the photosensitive units 102 and reflected by metal film layers may be absorbed through the pixel definition layer 105 while not increasing the thickness of the display panel.

In some embodiments, referring to FIG. 2A and FIG. 2B, the light-emitting element layer 200 further includes a cathode layer 203 located on the pixel definition layer 105 and the anode layer 202. The cathode layer 203 includes a plurality of cathodes included in the light-emitting elements 201. The cathode layer 203 is provided with a plurality of fourth photosensitive openings corresponding to the plurality of photosensitive units 102 to reduce the reflection of the light emitted by the light-emitting elements 201.

In some embodiments, the array substrate 100 further includes an active layer 1002, a first gate insulation layer 1003, a first gate layer 1004, a second gate insulation layer 1005, a second gate layer 1006, an interlayer dielectric layer 1007, a first electrode layer 1008, a second protective layer 1042, a first source-drain layer 1009, and a second source-drain layer 1010.

In some embodiments, the active layer 1002 is located on the substrate 1001, the first gate insulation layer 1003 is located on the active layer 1002, the first gate layer 1004 is located on the first gate insulation layer 1003, the second gate insulation layer 1005 is located on the first gate layer 1004, the second gate layer 1006 is located on the second gate insulation layer 1005, the interlayer dielectric layer 1007 is located on the second gate layer 1006, the second protective layer 1042 is located on the interlayer dielectric layer 1007, the first electrode layer 1008 is located on the second protective layer 1042, the first protective layer 1041 is located on the first electrode layer 1008 and the second protective layer 1042, the first source-drain layer 1009 is located between the first protective layer 1041 and the first planarization layer 1031, and the second source-drain layer 1010 is located between the first planarization layer 1031 and the second planarization layer 1032.

In some embodiments, the active layer 1002 includes a silicon semiconductor material or an oxide semiconductor material. In some embodiments, the silicon semiconductor material may include single crystal silicon, polycrystalline silicon, or the like. The oxide semiconductor material may include indium gallium zinc oxide (IGZO), indium gallium tin oxide (IGTO), indium gallium zinc tin oxide (IGZTO), or the like.

In some embodiments, the first gate insulation layer 1003, the second gate insulation layer 1005, the interlayer dielectric layer 1007, or the second protection layer 1042 may include a silicon compound, a metal oxide, or the like. Furthermore, the first gate insulation layer 1003, the second gate insulation layer 1005, the interlayer dielectric layer 1007, or the second protective layer 1042 may include a silicon oxide, a silicon nitride, a silicon oxynitride, an aluminum oxide, a tantalum oxide, a hafnium oxide, a zirconium oxide, a titanium oxide, or the like.

In some embodiments, the first gate layer 1004, the second gate layer 1006, the first source-drain layer 1009, or the second source-drain layer 1010 may include molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and the like. In some embodiments, the first gate layer 1004, the second gate layer 1006, the first source-drain layer 1009, or the second source-drain layer 1010 may have a single-layer film structure or a laminated structure such as Ti/Al/Ti, Mo/Al/Mo, Mo/AlGe/Mo, Cu/Mo, Cu/Ti, Cu/MoTi, Cu/MoNb, or the like.

In some embodiments, the first electrode layer 1008 includes a transparent electrode material. In some embodiments, the first electrode layer 1008 includes indium tin oxide or the like.

In some embodiments, the display panel further includes an encapsulation layer 1012 located between the light-emitting element layer 200 and the touch layer 106. In some embodiments, the encapsulation layer 1012 includes a stacked structure of organic layers and inorganic layers. In some embodiments, the display panel further includes an insulation layer 1013 located between the touch layer 106 and the light shielding layer 107. In some embodiments, the display panel further includes spacer 1014 for supporting a photomask for evaporating the light-emitting layer.

The display panel is simulated, and the results of the optical signal-to-noise ratio of the display panel before and after improvement are illustrated in Table 1.

|  | Existing Design | This Application |
|---|---|---|
| Effective Signal (N/cm²/S) | 3.34151E+13 | 5.16657E+12 |
| Sunlight Noise (N/cm²/S) | 2.01967E+14 | 4.34681E+12 |
| Signal-to-Noise Ratio (SNR) | 0.17 | 1.19 |

It can be seen from Table 1 that in the existing design (in the existing design, the first planarization layer 1031 and the second planarization layer 1032 have the same refractive index, and the first planarization layer 1031 and the second planarization layers 1032 both include transparent organic materials), the optical signal-to-noise ratio of the display panel is 0.17, and the fingerprint recognition accuracy is low. After using the display panel of the present disclosure, the optical signal-to-noise ratio may be increased to 1.19, which is beneficial to improve the accuracy of fingerprint recognition.

The present disclosure also provides display devices. The display device includes any one of the above-mentioned display panels.

It can be understood that the display device may be a movable display device (such as a notebook computer, a mobile phone, etc.), a fixed terminal (such as a desktop computer, a TV, etc.), a measuring device (such as a sports bracelet, a thermometer, etc.), or the like.

In this paper, specific examples are used to illustrate the principles and implementation methods of the present disclosure, and the descriptions of the above embodiments are only used to help understand the methods and core ideas of the present disclosure. At the same time, for those skilled in the art, based on the idea of the present disclosure, there will be changes in the specific implementation and application scope. In summary, the contents of this specification should not be construed as limiting the present disclosure.

What is claimed is:

1. A display panel, comprising:

a substrate;

a plurality of pixel driving units, disposed on a side of the substrate;

a plurality of photosensitive units, disposed on the side of the substrate and each arranged between adjacent ones of the pixel driving units;

a first planarization layer, disposed on a side of the pixel driving units and the photosensitive units away from the substrate, and having a first refractive index;

a second planarization layer, disposed on a side of the first planarization layer away from the substrate and having a second refractive index less than the first refractive index; and a light-emitting element layer, disposed on a side of the second planarization layer away from the substrate, and comprising a plurality of light-emitting elements correspondingly and electrically connected to the pixel driving units; and a first protective layer, disposed between the photosensitive units and the first planarization layer, and having a third refractive index greater than the first refractive index, wherein at least one of the first planarization layer and the second planarization layer comprises a resistance material.

2. The display panel according to claim 1, wherein the first planarization layer comprises a first organic material and a first resistance material, the second planarization layer comprises a second organic material and a second resistance material, and a wavelength band of the light transmitted by the first resistance material and a wavelength band of the light transmitted the second resistance material partially overlap.

3. The display panel according to claim 2, wherein the first organic material and the second organic material are same, one of the first resistance material and the second resistance material is a blue resistance material.

4. The display panel according to claim 1, wherein the first planarization layer comprises a first organic material and a first resistance material, and the second planarization layer comprise a second organic material.

5. The display panel according to claim 4, wherein the first organic material and the second organic material are same, and the first resistance material is a blue resistance material.

6. The display panel according to claim 1, wherein the first planarization layer comprises a first organic material, and the second planarization layer comprise a second organic material and a second resistance material.

7. The display panel according to claim 6, wherein the first organic material and the second organic material are same, and the second resistance material is a blue resistance material.

8. The display panel according to claim 1, wherein the first protective layer comprises an inorganic material, and the third refractive index is greater than the second refractive index.

9. The display panel according to claim 1, further comprising:

a pixel definition layer, disposed between the second planarization layer and the light-emitting element layer, comprising first pixel openings corresponding to the light-emitting elements and first photosensitive openings corresponding to the photosensitive units, and comprising a black resistance material;

a touch layer, disposed on a side of the light-emitting element layer away from the substrate and comprising a metal sublayer, and the metal sublayer comprising second pixel openings corresponding to the light-emitting elements and second photosensitive openings corresponding to the photosensitive units; and a color filter layer, disposed on a side of the touch layer away from the substrate and comprising a light shielding layer and filter units, wherein the light shielding layer comprises third pixel openings corresponding to the light-emitting elements and third photosensitive openings corresponding to the photosensitive units, and the filter units are arranged corresponding to the third pixel openings.

10. The display panel according to claim 9, wherein the second pixel openings coincide with the second photosensitive openings, and orthographic projections of two of the light-emitting elements on the touch layer are located within one of the second pixel opening.

11. The display panel according to claim 9, wherein the light shielding layer comprises a black resistance material, and an orthographic projection of each of the light-photosensitive units on the light shielding layer is correspondingly located within a boundary of one of the third photosensitive openings.

12. The display panel according to claim 9, wherein the pixel definition layer is reused as another light shielding layer.

13. The display panel according to claim 9, wherein the light-emitting element layer further comprises an anode layer located on the second planarization layer, the anode layer comprises a plurality of anodes included in the light-emitting elements, each of the anode is electrically connected to a corresponding one of the pixel driving units, and the first pixel openings expose the plurality of anodes, respectively.

14. The display panel according to claim 13, wherein the light-emitting element layer further comprises a cathode layer located on the pixel definition layer and the anode layer, the cathode layer comprises a plurality of cathodes included in the light-emitting elements, and the cathode layer comprises a plurality of fourth photosensitive openings corresponding to the plurality of photosensitive units.

15. The display panel according to claim 1, wherein a sum of thicknesses of the first planarization layer and the second planarization layer is greater than or equal to 1 micron and less than or equal to 4 microns.

16. A display device, comprising the display panel of claim 1.

17. A display panel, comprising:

a substrate;

a plurality of pixel driving units, disposed on a side of the substrate;

a plurality of photosensitive units, disposed on the side of the substrate and each arranged between adjacent ones of the pixel driving units;

a first planarization layer, disposed on a side of the pixel driving units and the photosensitive units away from the substrate, and having a first refractive index;

a second planarization layer, disposed on a side of the first planarization layer away from the substrate and having a second refractive index less than the first refractive index; and a light-emitting element layer, disposed on a side of the second planarization layer away from the substrate, and comprising a plurality of light-emitting elements correspondingly and electrically connected to the pixel driving units, wherein at least one of the first planarization layer and the second planarization layer comprises a resistance material; and wherein the first planarization layer comprises a first organic material and a first resistance material, the second planarization layer comprises a second organic material and a second resistance material, and a wavelength band of the light transmitted by the first resistance material and a wavelength band of the light transmitted the second resistance material partially overlap.

18. The display panel according to claim 17, wherein the first organic material and the second organic material are same, one of the first resistance material and the second resistance material is a blue resistance material.

19. A display panel, comprising:

a substrate;

a plurality of pixel driving units, disposed on a side of the substrate;

a plurality of photosensitive units, disposed on the side of the substrate and each arranged between adjacent ones of the pixel driving units;

a first planarization layer, disposed on a side of the pixel driving units and the photosensitive units away from the substrate, and having a first refractive index;

a second planarization layer, disposed on a side of the first planarization layer away from the substrate and having a second refractive index less than the first refractive index; and a light-emitting element layer, disposed on a side of the second planarization layer away from the substrate, and comprising a plurality of light-emitting elements correspondingly and electrically connected to the pixel driving units, wherein at least one of the first planarization layer and the second planarization layer comprises a resistance material; and wherein the first planarization layer comprises a first organic material and a first resistance material, and the second planarization layer comprise a second organic material.

20. The display panel according to claim 19, wherein the first organic material and the second organic material are same, and the first resistance material is a blue resistance material.

* * * * *